(12) United States Patent
Ashida et al.

(10) Patent No.: US 6,531,747 B1
(45) Date of Patent: Mar. 11, 2003

(54) SEMICONDUCTOR DEVICE

(75) Inventors: Motoi Ashida, Hyogo (JP); Yoshikazu Kamitani, Hyogo (JP); Eiji Hamasuna, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/553,334

(22) Filed: Apr. 20, 2000

(30) Foreign Application Priority Data

Oct. 25, 1999 (JP) .......................................... 11-302270

(51) Int. Cl.[7] .............................................. H01L 29/76
(52) U.S. Cl. ....................................... 257/368; 438/241
(58) Field of Search ............................... 438/279, 241; 257/393, 903, 904, 397, 380, 381, 370, 368

(56) References Cited

U.S. PATENT DOCUMENTS

| | | | | |
|---|---|---|---|---|
| 5,471,085 A | * | 11/1995 | Ishigaki et al. | 257/370 |
| 5,763,910 A | * | 6/1998 | Ema | 257/296 |
| 6,004,842 A | * | 12/1999 | Ikemasu et al. | 438/241 |
| 6,023,101 A | | 2/2000 | Tomita | 257/73 |
| 6,072,241 A | * | 6/2000 | Kojima | 257/752 |
| 6,078,073 A | | 6/2000 | Habu et al. | 257/296 |
| 6,156,639 A | | 12/2000 | Fukao et al. | 438/629 |

FOREIGN PATENT DOCUMENTS

| | | |
|---|---|---|
| DE | 19831349 A1 | 6/1999 |
| DE | 19840988 A1 | 8/1999 |
| EP | 0646952 A2 | 4/1995 |
| JP | 7-169858 | 7/1995 |
| JP | 8-31797 | 2/1996 |

OTHER PUBLICATIONS

"A Novel 6T–SRAM Cell Technology Designed with Rectangular Patterns Scalable Beyond 0.18μm Generation and Desirable for Ultra High Speed Operation", by M. Ishida, et al., International Electron Devices Meeting 1998, pp. 201–204.

* cited by examiner

Primary Examiner—David Nelms
Assistant Examiner—David Vu
(74) Attorney, Agent, or Firm—McDermott, Will & Emery

(57) ABSTRACT

A driver transistor including a gate electrode is formed on the surface of a p well of a silicon substrate. A silicon oxide film and a silicon nitride film are formed to cover the driver transistor. An interlayer insulator film is formed on the silicon nitride film. A contact hole is arranged to planarly overlap with at least the gate electrode. Thus, a semiconductor device capable of performing desired operations and reducing a memory cell area is obtained.

16 Claims, 16 Drawing Sheets

SEMICONDUCTOR DEVICE

BACKGROUND OF THE INVENTION

1. Field of the Invention

The present invention relates to a semiconductor device, and more particularly, it relates to a semiconductor device having a static random access memory (hereinafter referred to as "SRAM") cell.

2. Description of the Prior Art

In recent years, it is important to save energy for and reduce the voltage of a semiconductor device built in a portable device, so that the portable device can be driven by a battery as long as possible. Following this, an SRAM operable at a low voltage with low power consumption is increasingly demanded.

In order to satisfy such requirements, a CMOS memory cell is employed as the memory cell of the SRAM. The CMOS memory cell is formed by four n-channel MOS transistors and two p-channel MOS transistors.

In general, two access transistors and two driver transistors are employed for an SRAM memory cell. For the CMOS memory cell, two load transistors are further employed as load elements in addition to these transistors.

A conventional CMOS memory cell is now described with reference to FIG. 19. Referring to FIG. 19, element forming regions 120a, 120b, 120c and 120d separated by a field isolation film 103 are formed on the surface of a silicon substrate. An access transistor T1 and a driver transistor T3 are formed on the element forming region 120a.

An access transistor T2 and a driver transistor T4 are formed on the element forming region 120b. A load transistor T5 is formed on the element forming region 120c. A load transistor T6 is formed on the element forming region 120d.

A gate electrode 104c is formed across the element forming regions 120a and 120b. A gate electrode 104a is formed across the element forming regions 120a and 120c. A gate electrode 104b is formed across the element forming regions 120b and 120d. Contact holes 112a, 112b and 112c are formed to expose the surface of the element forming region 120a.

Contact holes 112d, 112e and 112f are formed to expose the surface of the element forming region 120b. Contact holes 112g and 112h are formed to expose the surface of the element forming region 120c. Contact holes 112i and 112j are formed to expose the surface of the element forming region 120d.

Contact holes 112k and 112m are formed to expose the surface of an n well 102b. A gate electrode 104d belongs to another memory cell adjacent to this memory cell. A plurality of such memory cells are formed on a silicon substrate in a single SRAM.

An exemplary method of manufacturing the aforementioned memory cell is now described with reference to sectional views taken along the line XX—XX in FIG. 19. Referring to FIG. 20, a p well 102a is formed on a prescribed region of a silicon substrate 101. The gate electrodes 104a and 104d are formed on the surface of the p well 102a through a gate insulator film 105 with masks of on-gate insulator films 106a and 106b.

An impurity such as phosphorus, for example, is injected through the gate electrodes 104a and 104d and the on-gate insulator films 106a and 106b serving as masks, thereby forming an n⁻drain region 109a and an n⁻source region 109b.

Referring to FIG. 21, a silicon oxide film (not shown) is formed by CVD, for example, to cover the gate electrodes 104a and 104d and the on-gate insulator films 106a and 106b. The silicon oxide film is anisotropically etched thereby forming side wall insulator films 107a on both side surfaces of the gate electrode 104a. Further, side wall insulator films 107b are formed on both side surfaces of the gate electrode 104d.

An n-type impurity is injected through the side wall insulator films 107a and 107b and the on-gate insulator films 106a and 106b serving as masks, thereby forming an n⁺drain region 110a and an n⁺source region 110b.

Referring to FIG. 22, an interlayer insulator film 111 consisting of a silicon oxide film is formed on the silicon substrate 101 by CVD, to cover the side wall insulator films 107a and 107b and the on-gate insulator films 106a and 106b. A prescribed resist pattern (not shown) is formed on the interlayer insulator film 111.

The interlayer insulator film 111 is anisotropically etched through the resist pattern serving as a mask, thereby forming the contact hole 112b exposing the surface of the n⁺drain region 10a. Further, the contact hole 112c is formed to expose the surface of the n⁺source region 110b.

Referring to FIG. 23, a barrier metal film 113 consisting of a titanium film and a titanium nitride film is formed by sputtering, for example, to cover the side surfaces and the bottom surfaces of the contact holes 112a and 112c and the upper surface of the interlayer insulator film 111. A tungsten film (not shown) is formed on the barrier metal film 113 by CVD, for example.

A resist pattern (not shown) is formed on the tungsten film. The tungsten film and the barrier metal film 113 are anisotropically etched through the resist pattern serving as a mask, thereby forming wiring layers 114a, 114b and 114c. A principal part of the memory cell of the SRAM is completed through the aforementioned steps.

In the aforementioned SRAM, however, six MOS transistors must be formed for each memory cell. As compared with another high-resistance memory cell, for example, employing no transistors as load elements, therefore, the area occupied by the memory cell is increased.

Further, the contact holes for electrical connection with the transistors must be provided for the respective transistors. Consequently, the size of the semiconductor chip may be disadvantageously increased.

When approximating the contact holes to the gate electrode or narrowing the element forming regions in order to solve these problems, however, the following problems arise:

When approximating the contact holes to the gate electrode, the surface of the gate electrode 104a may be exposed when the contact hole 112c is formed in the step shown in FIG. 22, for example. Therefore, tungsten embedded in the contact hole 112c may be shorted to the gate electrode 104a.

When narrowing the element forming regions, the field isolation film 103 may be excessively etched when the contact hole 112b is formed in the step shown in FIG. 22, for example. Therefore, a current may leak from tungsten embedded in the contact hole 112b to the p well 102 through the excessively etched part of the field isolation film 103.

Therefore, the area occupied by the memory cell is so hard to narrow that the chip size cannot be reduced.

SUMMARY OF THE INVENTION

The present invention has been proposed in order to solve the aforementioned problems, and an object thereof is to provide a semiconductor device capable of performing desired operations and reducing the chip size.

A semiconductor device according to a first aspect of the present invention comprises a first conductivity type region, an element forming region, a semiconductor element, an insulator film and a first contact hole. The first conductivity type region is formed on the main surface of a semiconductor substrate. The element forming region is separated on the main surface of the semiconductor substrate by an element isolation film and formed on the surface of the first conductivity type region. The semiconductor element is formed on the element forming region. The insulator film is formed on the semiconductor substrate to cover the semiconductor element. The first contact hole is formed in the insulator film, to expose the surface of the element forming region. The semiconductor element has an electrode part, a pair of second conductivity type first impurity regions, and a second conductivity type second impurity region. The electrode part is formed across the element forming region. The pair of second conductivity type first impurity regions are formed on one side and another side of the element forming region through the electrode part respectively, and have a first impurity concentration. The second conductivity type second impurity region is formed on at least one of the first impurity regions to include a contact part of the first contact hole, and has a second impurity concentration higher than the first impurity concentration. An etching prevention film different in etching property from the insulator film is formed between the insulator film and the semiconductor element to cover the electrode part in direct contact with both side surfaces of the electrode part. The first contact hole is arranged to planarly overlap with the electrode part. The wording "planarly overlap" means "overlap with respect to the layout pattern of the semiconductor device". This also applies to the following description.

Although the first contact hole is arranged on the position planarly overlapping with the electrode part according to this semiconductor device, the surface of the electrode part is not exposed by etching for forming the first contact hole but the surface of the element forming region is exposed in a self-aligned manner since the electrode part is covered with the etching prevention film coming into direct contact with the side surfaces. Therefore, the electrode part is not shorted to a wiling material embedded in the first contact hole. Consequently, a semiconductor device having a further reduced chip size and performing desired operations is obtained.

Preferably, the insulator film includes a silicon oxide film, and the etching prevention film includes at least a silicon nitride film.

In this case, the ratio (etching selection ratio) of the etching rate for the insulator film to the etching rate for the etching prevention film for forming the first contact hole can be increased so that the silicon oxide film can be etched without substantially etching the silicon nitride film.

More preferably, the etching prevention film further includes a silicon oxide film formed under the silicon nitride film.

In this case, the etching selection ratio can be more increased.

More preferably, the insulator film contains an impurity for improving the etching selection ratio with respect to the etching prevention film.

Also in this case, the etching selection ratio can be more increased.

Such an impurity is preferably prepared from phosphorus or boron.

Preferably, the semiconductor device further includes another electrode part formed across the element forming region at a space from the electrode part, the other electrode part is covered with the etching prevention film coming into direct contact with at least the side surfaces, and the first contact hole is arranged to planarly overlap with the other electrode part.

In this case, the first contact hole is arranged to planarly overlap with the other electrode part, whereby the chip size of the semiconductor device having a plurality of electrode parts can be readily reduced.

It is preferable that the space between the electrode part and the other electrode part is longer than twice the thickness of the etching prevention film and the thickness of the etching prevention film is smaller than the height of the electrode part and the other electrode part.

In this case, the surface of the element forming region located between the electrode part and the other electrode part adjacent to each other can be reliably exposed in a self-aligned manner when forming the first contact hole.

Further, the second impurity region is preferably formed by introducing an impurity through a contact part of the first contact hole.

In this case, the second impurity region can be readily formed in a self-aligned manner through the contact part.

Preferably, the semiconductor device further comprise a second contact hole formed in the insulator film and arranged not to planarly overlap with the electrode part and a second conductivity type third impurity region including a contact part of the second contact hole, formed on another one of the first impurity regions and having a third impurity concentration higher than the first impurity concentration, the semiconductor element is a transistor including the third impurity region, and the distance between the third impurity region and a portion immediately under the side surface of the electrode part on the side where the third impurity region is located on the main surface of the semiconductor substrate is longer than the distance between the second impurity region and a portion immediately under the side surface of the electrode part on the side where the second impurity region is located on the main surface of the semiconductor substrate.

In this case, a transistor having the pair of first impurity regions, the second impurity region and the third impurity region can have a kind of parasitic resistance consisting of the first impurity regions between the third impurity region and the portion immediately under the side surface of the electrode part on the side where the third impurity region is located. Current drivability of the transistor having such parasitic resistance can be intentionally reduced.

The third impurity region is preferably formed by introducing an impurity through the contact part of the second contact hole.

In this case, the third impurity region can be readily formed in a self-aligned manner through the contact part.

Preferably, the element isolation film is covered with the etching prevention film, and the first or second contact hole is arranged to planarly overlap with the element isolation film.

In this case, the element forming region can be further narrowed for further reducing the chip size of the semiconductor device. The element isolation film, covered with the etching prevention film, is not excessively etched when forming each contact hole. The second or third impurity region is formed by introducing the impurity through the contact part of each contact hole, thereby suppressing current leakage from a portion close to the boundary between the element isolation film and the element forming region.

Preferably, the semiconductor device further comprises a third contact hole formed in the insulator film to planarly overlap with the electrode part and a second conductivity type fourth impurity region including a contact part of the third contact hole, formed on another one of the first impurity regions and having a second impurity concentration higher than the first impurity concentration, the semiconductor element is a transistor further including the fourth impurity region, and the distance between the fourth impurity region and a portion immediately under the side surface of the electrode part on the side where the fourth impurity region is located on the main surface of the semiconductor substrate is substantially identical to the distance between the second impurity region and a portion immediately under the side surface of the electrode part on the side where the second impurity region is located on the main surface of the semiconductor substrate.

In this case, a transistor having the electrode part, the pair of first impurity regions, the second impurity region and the fourth impurity region is reduced in dispersion of operations and stabilized in operation due to the aforementioned distance relation.

Preferably, the electrode length of the electrode part is larger in the portion where the first contact hole and the third contact hole overlap with the electrode part as compared with the remaining portion.

In this case, the first contact hole and the third contact hole located on both sides of the electrode part can be readily formed without substantially widening the element forming region.

Preferably, the first or third contact hole is arranged to planarly overlap with the element isolation film.

In this case, the element forming region can be further narrowed, for further reducing the chip size of the semiconductor device. Further, the element isolation film, covered with the etching prevention film, can be inhibited from excessive etching when forming the first and third contact holes, for suppressing a leakage current.

More preferably, the fourth impurity region is formed by introducing an impurity through the contact part of the third contact hole.

In this case, the fourth impurity region can be readily formed in a self-aligned manner through the contact part.

Preferably, the semiconductor device further comprises a second contact hole formed in the insulator film and arranged not to planarly overlap with the electrode part, a second conductivity type third impurity region including a contact part of the second contact hole, formed on another one of the first impurity regions and having a second impurity concentration higher than the first impurity concentration, a third contact hole formed in the insulator film and arranged to planarly overlap with the electrode part, and a second conductivity type fourth impurity region including a contact part of the third contact hole, formed on another one of the first impurity regions and having a second impurity concentration higher than the first impurity concentration. It is preferable that a plurality of semiconductor devices are formed on the semiconductor substrate, and the semiconductor element includes a first transistor having the electrode part, the pair of first impurity regions, the second impurity region and the third impurity region and a second transistor having the electrode part, the pair of first impurity regions, the second impurity region and the fourth impurity region. Further, the distance between the third impurity region and a portion immediately under the side surface of the electrode part on the side where the third impurity region is located on the main surface of the semiconductor substrate is longer than the distance between the second impurity region and a portion immediately under the side surface of the electrode part on the side where the second impurity region is located on the main surface of the semiconductor substrate, and the distance between the fourth impurity region and a portion immediately under the side surface of the electrode part on the side where the fourth impurity region is located on the main surface of the semiconductor substrate is substantially identical to the distance between the second impurity region and the portion immediately under the side surface of the electrode part on the side where the second impurity region is located on the main surface of the semiconductor substrate.

In this case, the first transistor has a parasitic resistance as described above, so that the operability (current drivability) thereof can be intentionally reduced. The second transistor, having no such parasitic resistance, is inhibited from dispersion of operations and stabilized in operation.

Preferably, the semiconductor device has a static memory cell including a pair of driver transistors having cross-connected gates and drains, a pair of access transistors having sources connected to the drains of the driver transistors respectively, and a pair of load transistors having drains connected to the drains of the driver transistors respectively and gates connected to the gates of the driver transistors respectively, the access transistors are the first transistor, and the driver transistors and the load transistors are the second transistor.

In this case, the access transistors of the static memory cell are formed by the first transistor in particular, whereby current drivability of the access transistors is intentionally reduced due to presence of parasitic resistance and the ratio (beta ratio) of the current drivability of the driver transistors to the current drivability of the access transistors is increased. Consequently, operations of the static memory cell can be stabilized.

Preferably, the semiconductor device further comprises a conductor part formed to fill up the first contact hole and a wiring layer formed on the insulator film and electrically connected with the conductor part, the wiring layer partially covers the upper surface of the conductor part, and a portion of the upper surface of the conductor part not covered with the wiring layer is on a position lower than the upper surface of the insulator film.

In this case, the substantial horizontal space between adjacent wiring layers can be reduced for further reducing the size of a wire forming region as well as the chip size of the semiconductor device.

The semiconductor device preferably further comprises a fourth contact hole formed in the insulator film and the element isolation film for exposing the surface of the first conductivity type region.

In this case, the fourth contact hole for stabilizing the potential of the first conductivity type region can be readily formed with no restriction by the layout pattern.

A semiconductor device according to another aspect of the present invention comprises an insulator film, a contact hole, a conductor part and a wiring layer. The insulator film is formed on the main surface of a semiconductor substrate. The contact hole is formed in the insulator film for exposing the main surface of the semiconductor substrate. The conductor part is embedded in the contact hole. The wiring layer is formed on the insulator film and electrically connected with the conductor part. The wiring layer partially covers the upper surface of the conductor part, and a portion of the upper surface of the conductor part not covered with the wiring layer is on a position lower than the upper surface of the insulator film.

According to this semiconductor device, the portion of the upper surface of the conductor part not covered with the wiling layer is on the position lower than the upper surface of the insulator film, whereby the substantial horizontal distance between the wiring layer connected to the conductor part and another wiring layer can be reduced. Thus, the size of the region for forming the wiring layer as well as the chip size of the semiconductor device can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
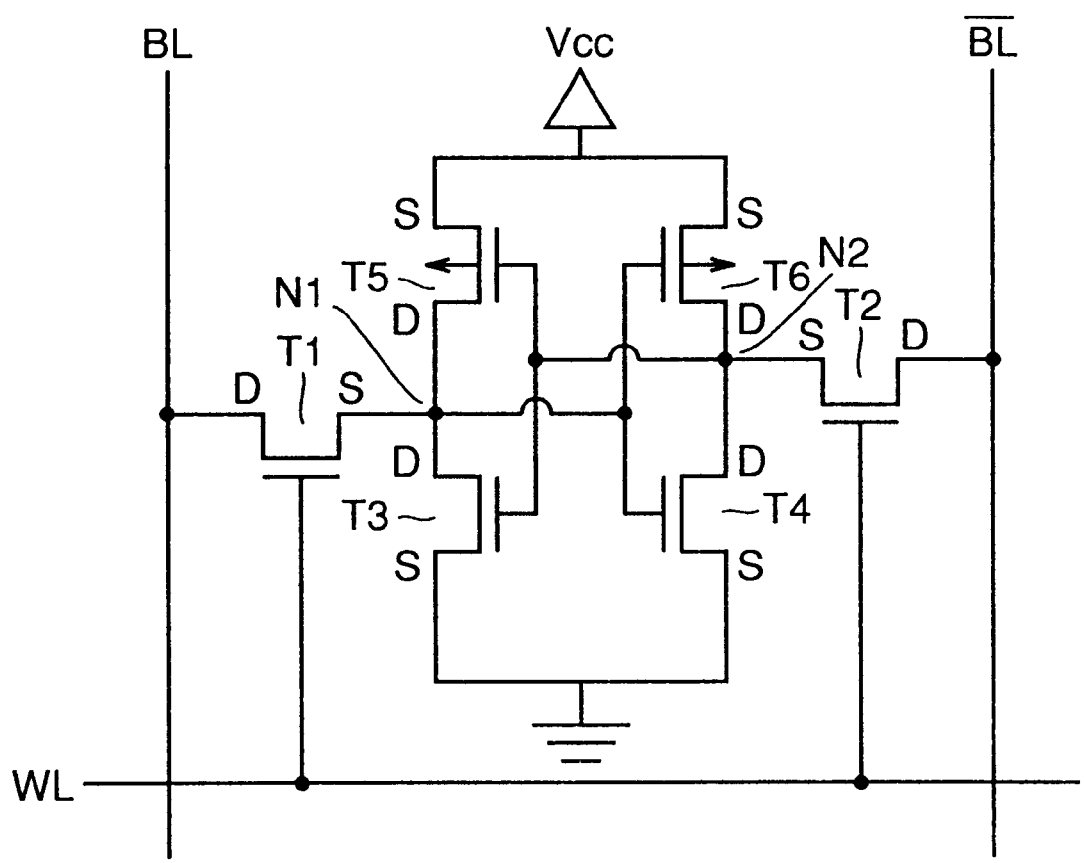
FIG. 1 illustrates an equivalent circuit of a memory cell of an SRAM according to a first embodiment of the present invention.
Figure 2:
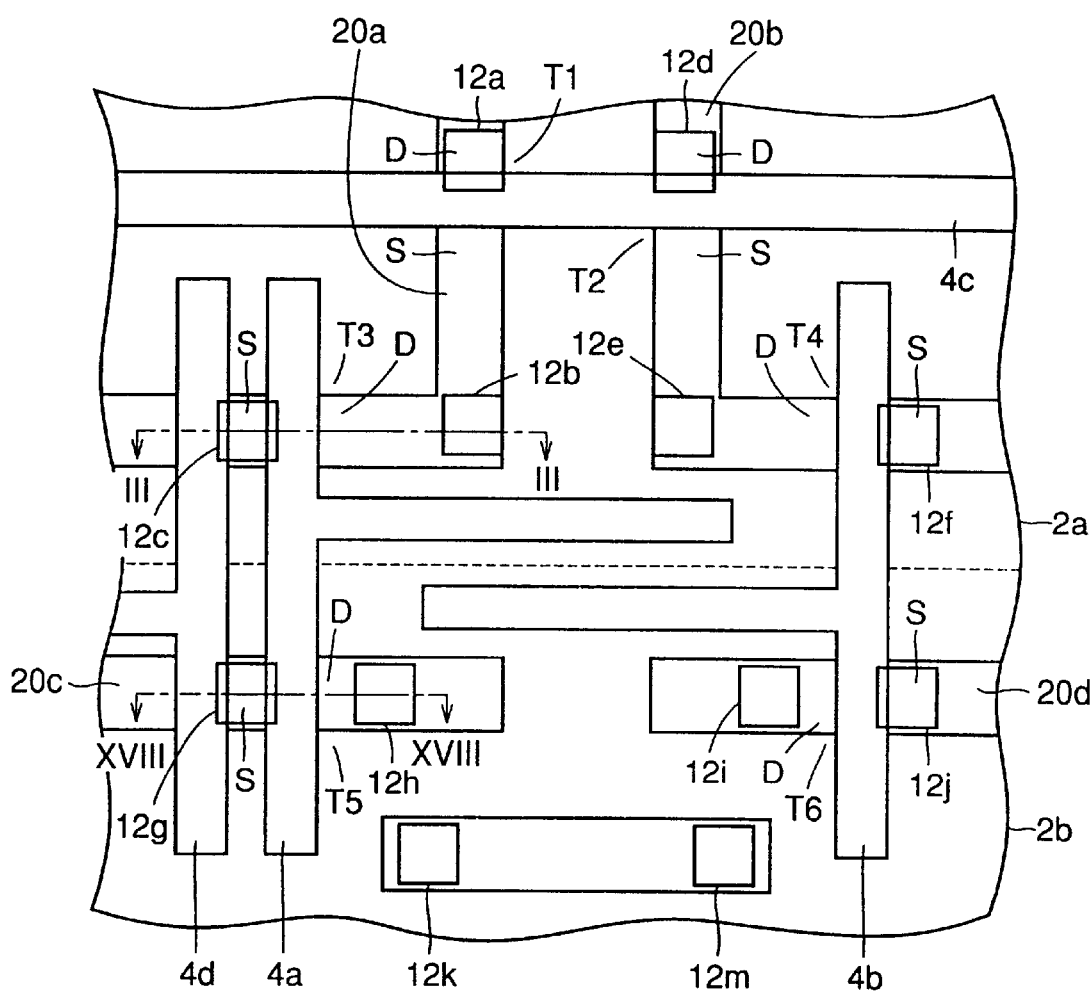
FIG. 2 illustrates a plane structure of the memory cell according to the first embodiment.

A semiconductor device comprising a static memory cell according to a first embodiment of the present invention is now described. FIGS. 1 and 2 show an equivalent circuit of the static memory cell and the plane structure thereof respectively. Referring to FIGS. 1 and 2, the memory cell is arranged on the intersection between complementary data lines (bit lines) and a word line arranged in the form of a matrix in an SRAM. The memory cell is formed by a flip-flop circuit and two access transistors T1 and T2.

In the flip-flop circuit, an inverter formed by a load transistor T5 and a driver transistor T3, another inverter formed by a load transistor T6 and a driver transistor T4, an input terminal and an output terminal are interconnected with each other thereby forming two storage nodes N1 and N2, for example.

The access transistor T1 and the driver transistor T3 are formed on an element forming region 20a. The access transistor T2 and the driver transistor T4 are formed on an element forming region 20b. A gate electrode 4c of the access transistor T2 and the access transistor T1 is formed across the element forming regions 20a and 20b.

The load transistor T5 is formed on an element forming region 20c. The load transistor T6 is formed on an element forming region 20d. A gate electrode 4a of the driver transistor T3 and the load transistor T5 is formed across the element forming regions 20a and 20c. A gate electrode 4b of the driver transistor T4 and the load transistor T6 is formed across the element forming regions 20b and 20d. A gate electrode 4d of another memory cell adjacent to this memory cell is arranged at a space from the gate electrode 4a.

The element forming regions 20a, 20b, 20c and 20d are separated by a field isolation film 3. A contact hole 12a is arranged for electrical connection with a drain region of the access transistor T1. A contact hole 12d is arranged for electrical connection with a drain region of the access transistor T2. A contact hole 12b is formed for electrical connection with a source region of the access transistor T1 and a drain region of the driver transistor T3.

A contact hole 12c is formed for electrical connection with a source region of the driver transistor T3. A contact hole 12e is formed for electrical connection with a source region of the access transistor T2 and a drain region of the driver transistor T4. A contact hole 12f is formed for electrical connection with a source region of the driver transistor T4.

Contact holes 12h and 12g are formed for electrical connection with drain and source regions of the load transistor T5 respectively. Contact holes 12i and 12j are formed for electrical connection with drain and source regions of the load transistor T6 respectively.

Further, contact holes 12k and 12m are formed for electrical connection with an n well. The contact hole 12b corresponds to the storage node N1. The contact hole 12e corresponds to the storage node N2. The contact holes 12c and 12f correspond to ground contacts. The contact holes 12g and 12j are connected to a power supply line ($V_{cc}$ line). The gate electrode 4c of the access transistors T1 and T2 is connected to a word line (WL). This word line controls conduction of the access transistors T1 and T2.

When the voltage of one of the storage nodes N1 and N2 is high, the voltage of the remaining storage node is low. This state is referred to as a bistable state. The memory cell can continuously hold the bistable state so far as a prescribed power supply voltage is applied to the memory cell. In the SRAM, a plurality of such memory cells are formed on the surface of a silicon substrate. Referring to FIGS. 1 and 2, symbols S and D denote the source and drain regions respectively.

Operations of this memory cell are now briefly described. In order to write data in this memory cell, the word line (WL) corresponding to the memory cell renders the access transistors T1 and T2 conductive while a voltage is forcibly applied to a pair of the complementary bit lines in response to a desired logical value. Thus, the potentials of the two storage nodes N1 and N2 are set in the aforementioned bistable state in the flip-flop circuit, for holding the data as the potential difference.

In order to read data, the access transistors T1 and T2 are rendered conductive thereby transmitting the potentials of the storage nodes N1 and N2 to the bit lines and reading the data.

Figure 3:
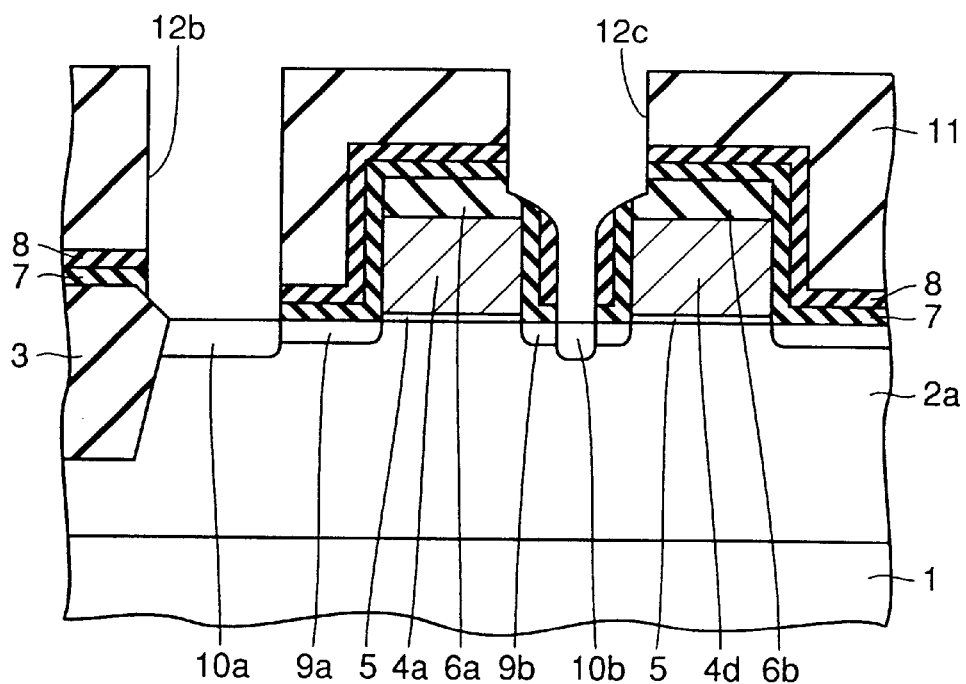
FIG. 3 is a sectional view taken along the line III—III in FIG. 2.

The sectional structure of the memory cell of the SRAM is now described with reference to a sectional view taken along the line III—III in FIG. 2. Referring to FIG. 3, a p well 2a is formed on a prescribed region of a silicon substrate 1. The gate electrode 4a and an on-gate insulator film 6a are formed on the surface of the p well 2a through gate oxide films 5. Similarly, the gate electrode 4d and an on-gate insulator film 6b are formed on the surface of the p well 2a.

An n⁻drain region 9a and an n⁻source region 9b are formed on the surface of the p well 2a through the gate electrode 4a. A silicon oxide film 7 and a silicon nitride film 8 defining an etching prevention film are formed to come into direct contact with both side surfaces of the gate electrodes 4a and 4d.

An interlayer insulator film 11 consisting of a silicon oxide film, for example, is formed on the silicon nitride film 8. The contact hole 12b exposing part of the field isolation film 3 and the surface of the n⁻drain region 9a is formed through the interlayer insulator film 11, the silicon nitride film 7 and the silicon oxide film 7. The contact hole 12c is formed to expose the surface of the n⁻source region 9b.

The contact hole 12b is formed to planarly overlap with the field isolation film 3. The contact hole 12c is formed to planarly overlap with the gate electrodes 4a and 4d. An n drain region 10a is formed by introducing a prescribed impurity through a contact part of the contact hole 12b.

An n⁻source region 10b is formed by introducing a prescribed impurity through a contact part of the contact hole 12c. A barrier metal film and a tungsten film are formed in the contact holes 12b and 12c, as described later.

Figure 4:
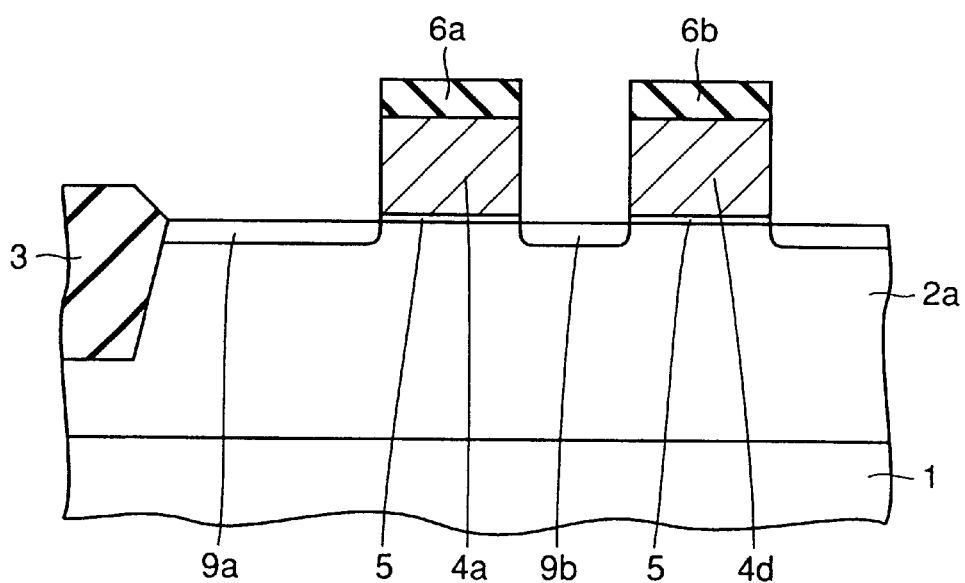
FIGS. 4 to 12 are sectional views taken along the line III—III in FIG. 2 showing steps of a method of manufacturing the memory cell of the SRAM shown in FIG. 2.

An exemplary method of manufacturing this SRAM is now described with reference to sectional views taken along the line III—III in FIG. 2. Referring to FIG. 4, the field isolation film 3 for forming the element forming regions is formed on the surface of the silicon substrate 1. Then, the p well 2a and an n well (not shown) are formed on prescribed regions.

The gate electrodes 4a and 4d and the on-gate insulator films 6a and 6b are formed on the surface of the p well 2a through the gate oxide films 5. An n-type impurity such as phosphorus, for example, is injected through the gate electrodes 4a and 4d and the on-gate insulator films 6a and 6b serving as masks, thereby forming the n⁻drain region 9a and the n⁻source region 9b respectively.

Figure 5:
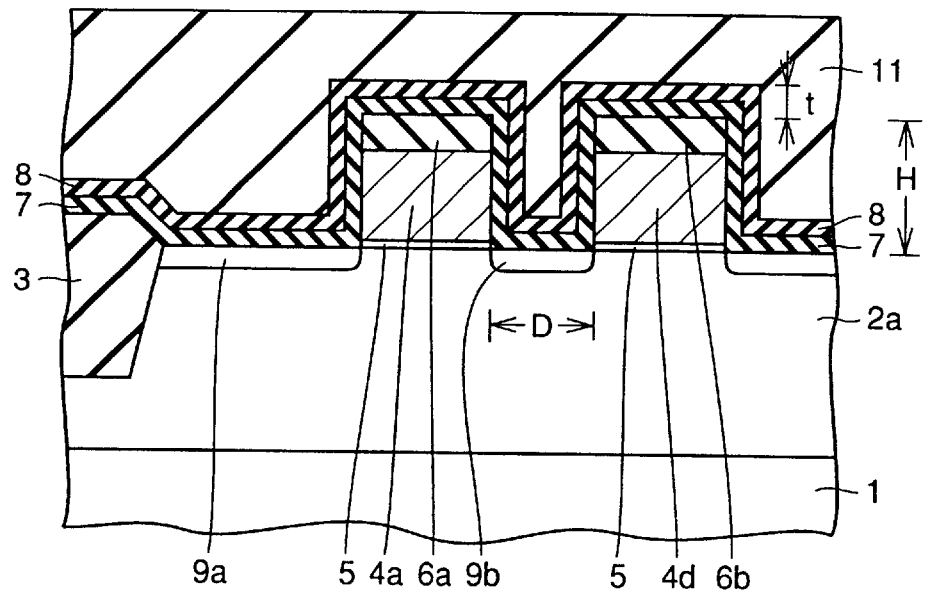

Referring to FIG. 5, the silicon oxide film 7 of 1 to 50 nm in thickness is formed by CVD, for example, to cover the gate electrodes 4a and 4d and the on-gate insulator films 6a and 6b. The silicon nitride film 8 of 1 to 50 nm in thickness is formed on the silicon oxide film 7 by CVD, for example. The interlayer isolation film 111 consisting of a silicon oxide film having a thickness of 100 to 1000 nm is formed on the silicon nitride film 8 by CVD, for example. The silicon oxide film 7 and the silicon nitride film 8 define the etching prevention film when forming the contact holes, as described later.

Figure 6:
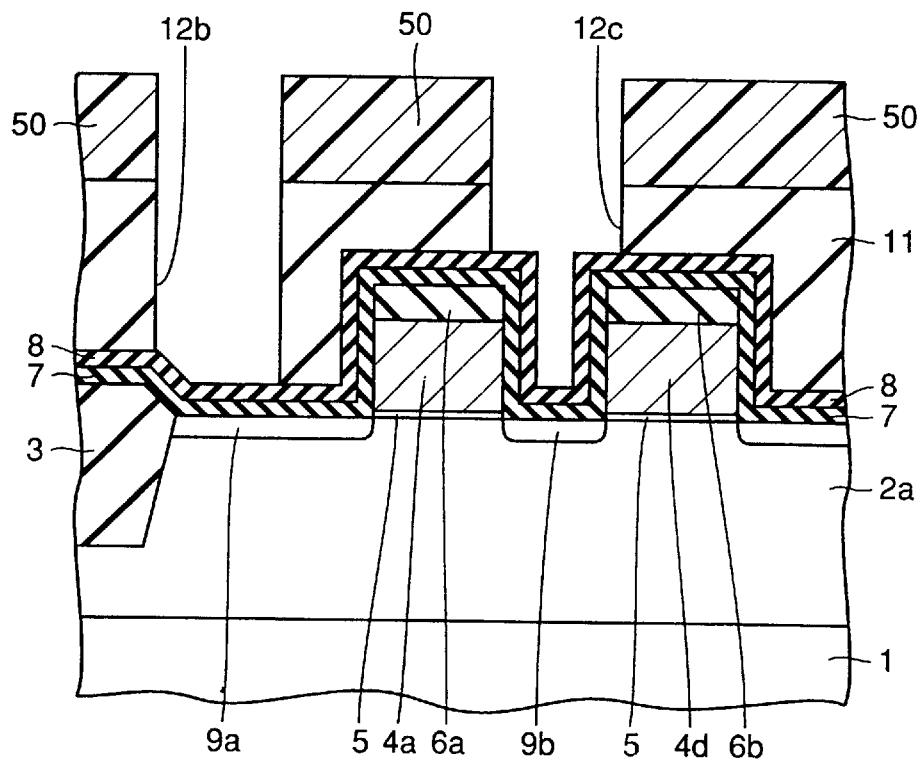

Referring to FIG. 6, a resist pattern 50 is formed on the interlayer insulator film 11. The interlayer insulator film 11 is anisotropically etched with an etching gas containing $C_4F_8$, for example, through the resist pattern 50 serving as a mask, thereby exposing the surface of the silicon nitride film 8. In this anisotropic etching, the etching rate for the silicon nitride film 8 is preferably not more than $\frac{1}{10}$ the etching rate for the interlayer insulator film 11.

Figure 7:
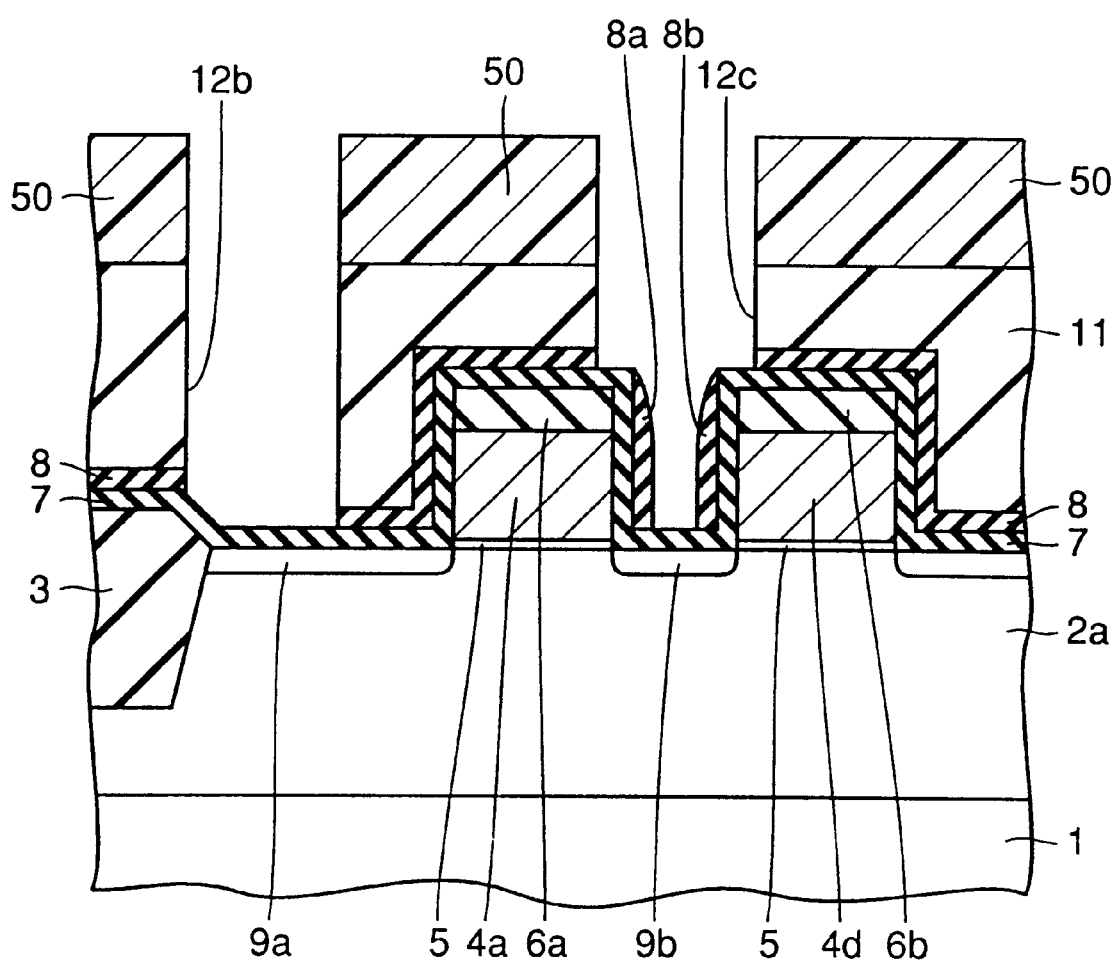

Referring to FIG. 7, the exposed silicon nitride film 8 is anisotropically etched with an etching gas containing $CH_2F_2$, for example, through the resist pattern 50 serving as a mask, thereby exposing the surface of the silicon oxide film 7. In this anisotropic etching, the etching rate for the silicon oxide film 7 is preferably not more than $\frac{1}{10}$ the etching rate for the silicon nitride film 8. Through this anisotropic etching, silicon nitride films 8a and 8b remain on the side surfaces of the gate electrodes 4a and 4d facing each other.

Figure 8:
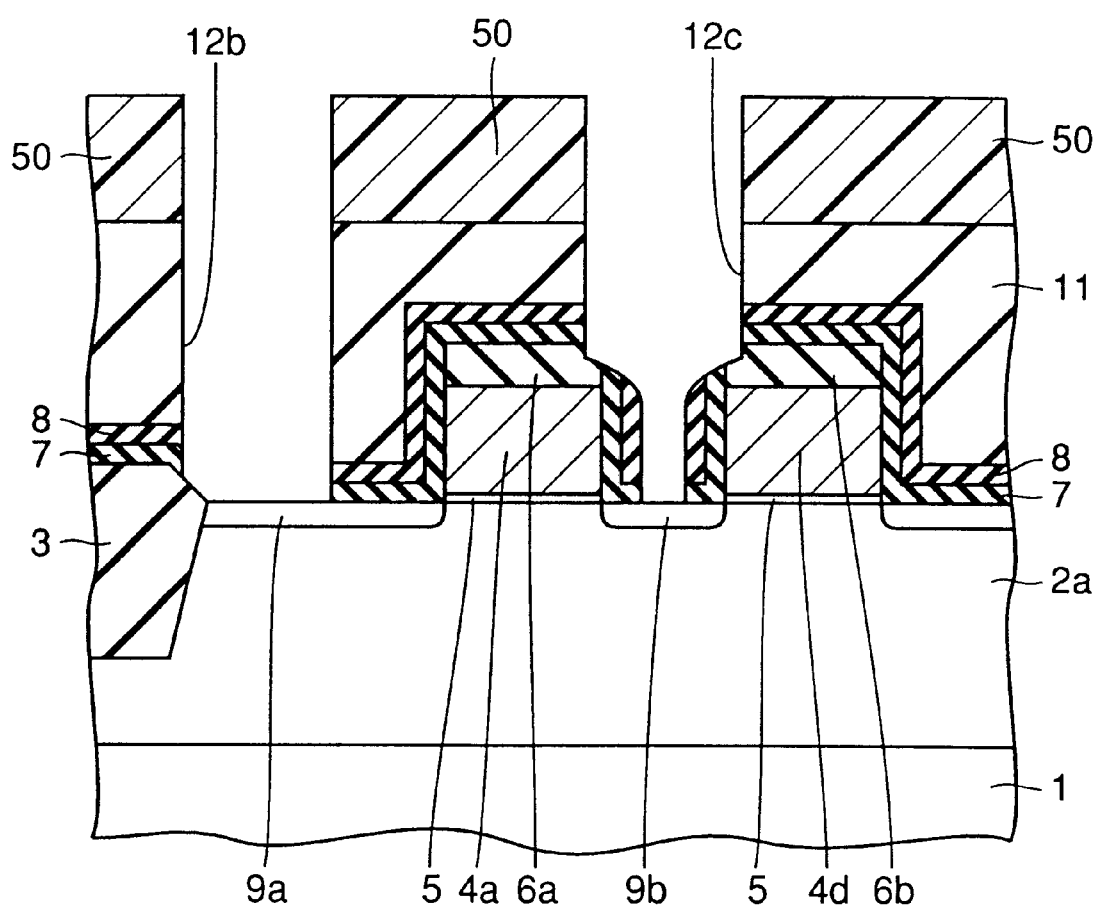

Referring to FIG. 8, the exposed silicon oxide film 7 is anisotropically etched with an etching gas containing $CHF_3$, for example, through the resist pattern 50 serving as a mask, thereby forming the contact hole 12b exposing the surface of the n⁻drain region 9a. Similarly, the contact hole 12c is formed to expose the surface of the n⁻drain region 9b. Thereafter the resist pattern 50 is removed.

Figure 9:
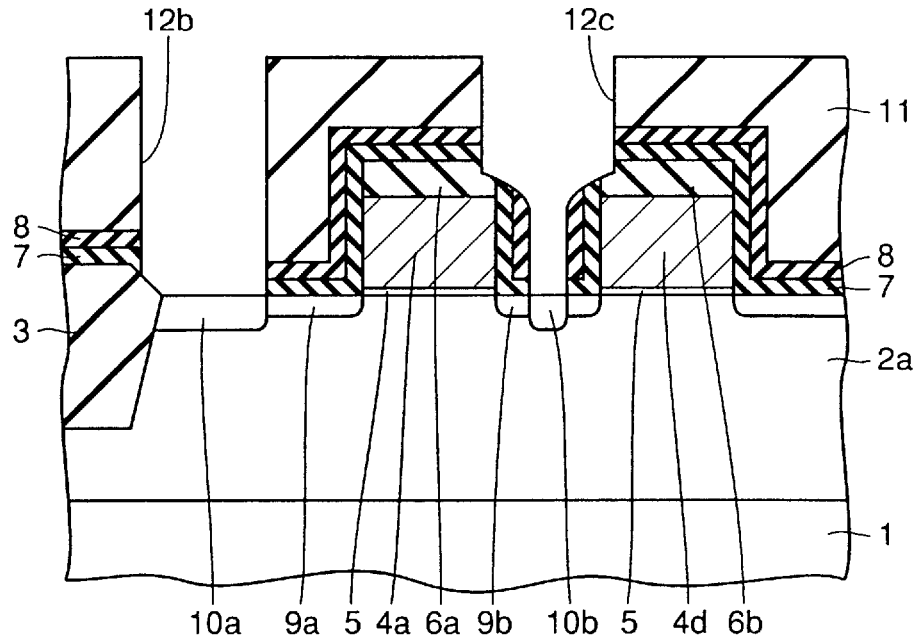

Referring to FIG. 9, the n⁻drain region 10a is formed by injecting an n-type impurity such as arsenic, for example, through the contact part of the contact hole 12b. Further, the n⁻source region 10b is formed by injecting an n-type impurity through the contact part of the contact hole 12c.

Figure 10:
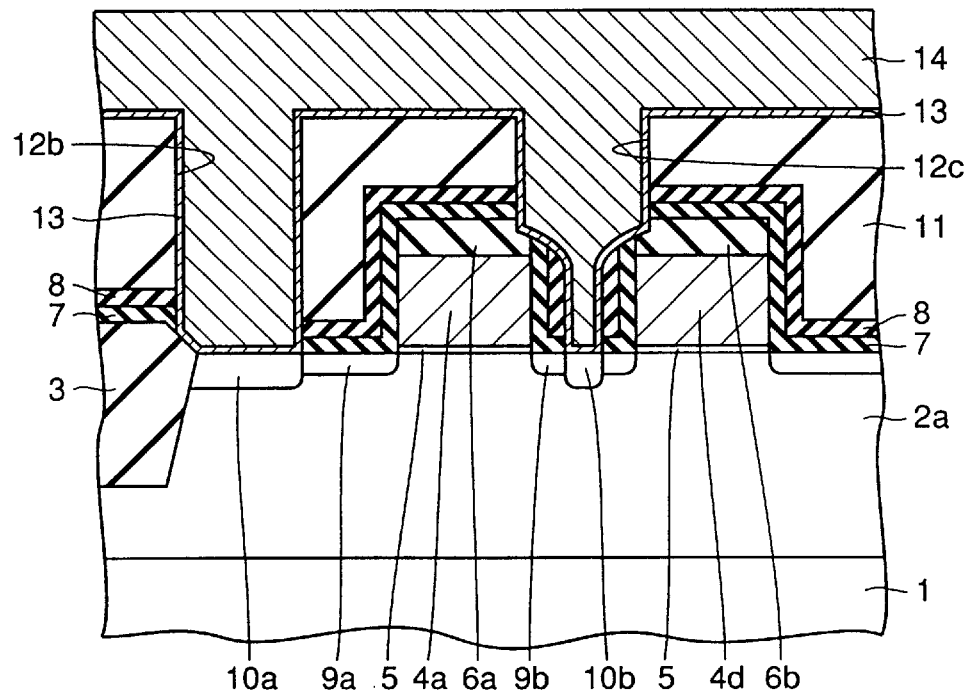

Referring to FIG. 10, a titanium film (not shown) of about 30 nm in thickness is formed on the side surfaces and the bottom surfaces of the contact holes 12b and 12c and the upper surface of the interlayer insulator film 11 by sputtering, for example. A titanium nitride film of about 50 nm in thickness is formed on the titanium film by sputtering, for example. The titanium film and the titanium nitride film define a barrier metal film 13. A tungsten film 14 is formed on the barrier metal film 13 by CVD, for example.

Figure 11:
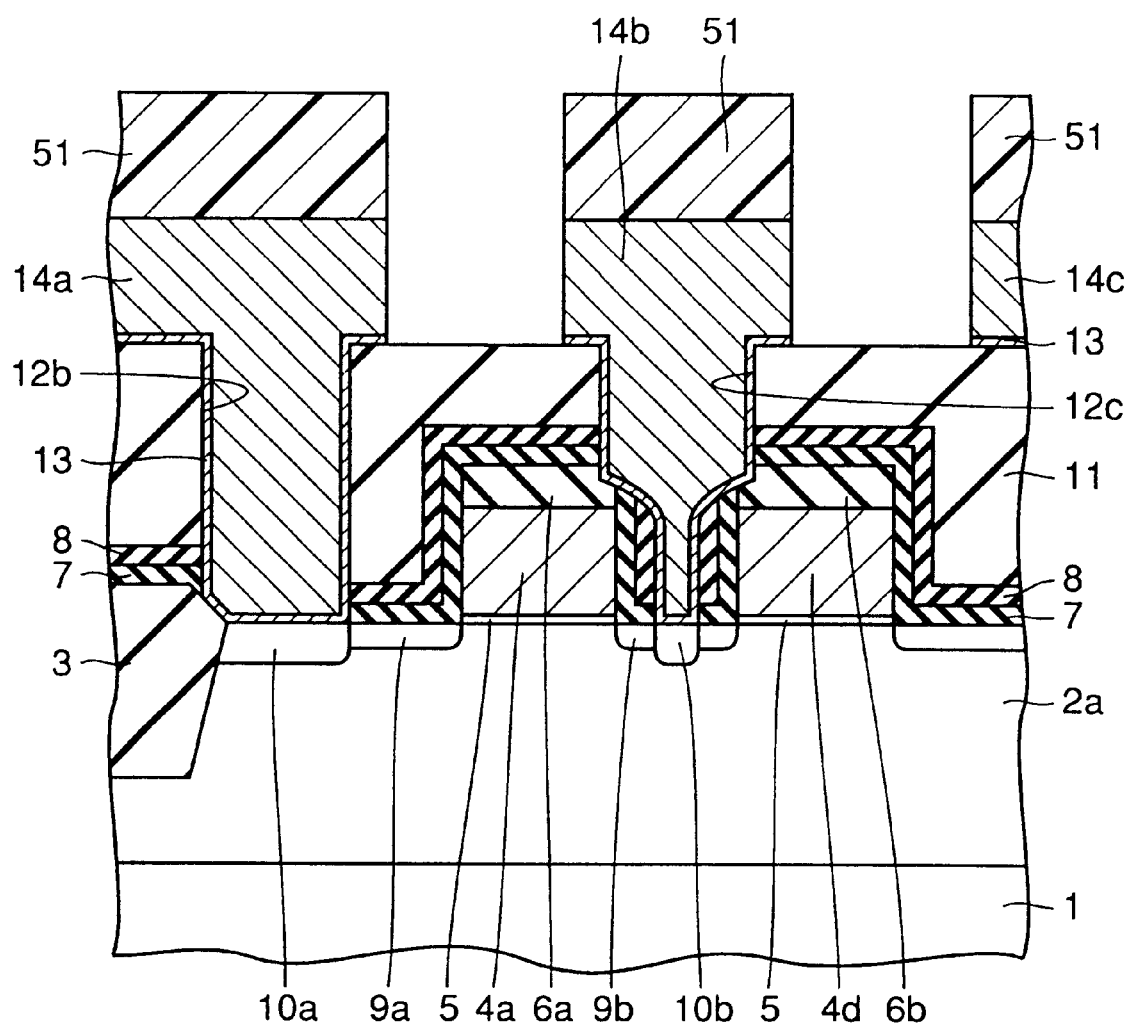

Referring to FIG. 11, a resist pattern 51 is formed on the tungsten film 14. The tungsten film 14 and the barrier metal film 13 are anisotropically etched through the resist pattern 51 serving as a mask, thereby forming upper connection wires 14a, 14b and 14c respectively. Thereafter the resist pattern 51 is removed.

Figure 12:
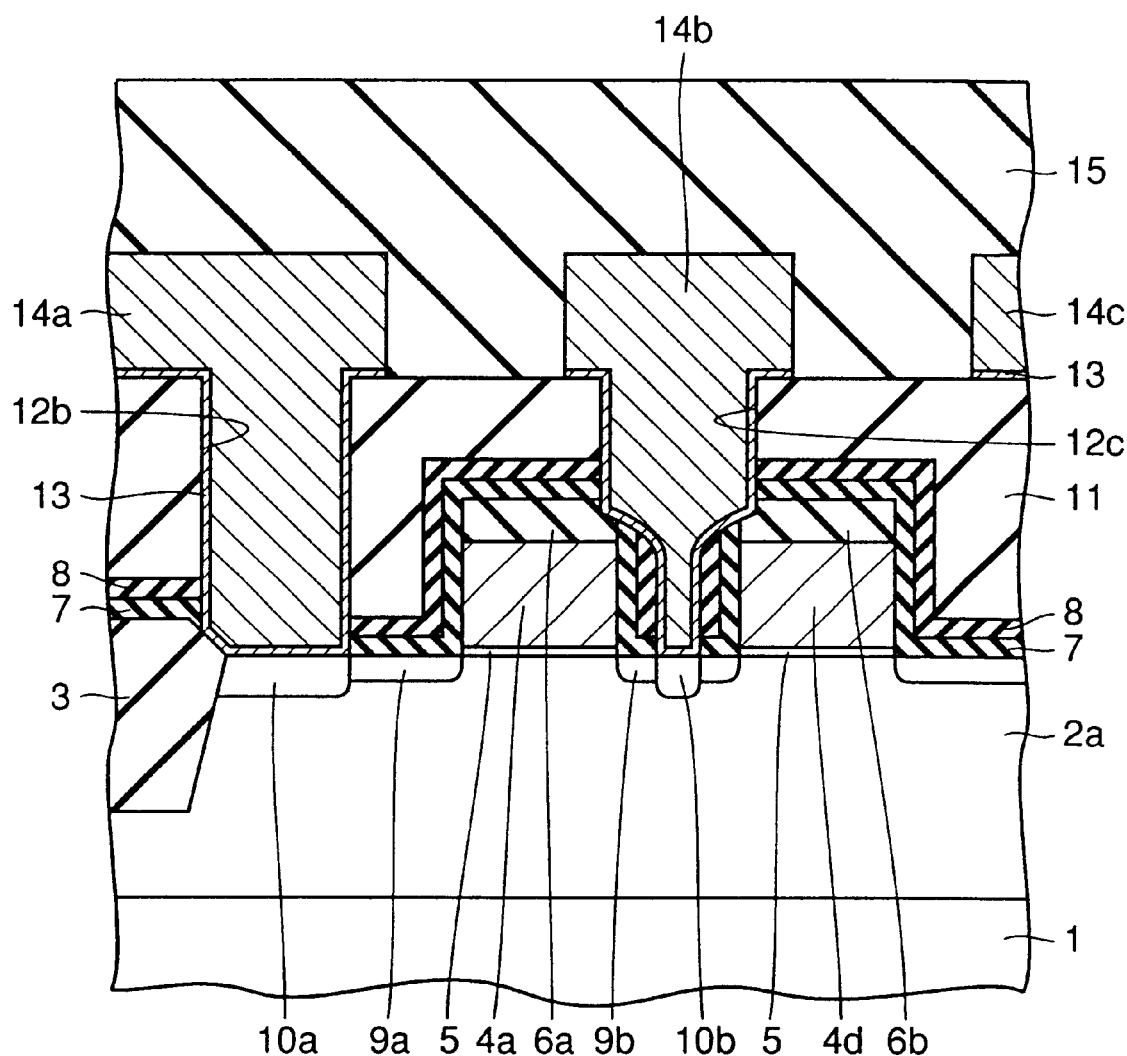

Referring to FIG. 12, an insulator film 15 such as a silicon oxide film is formed further on the interlayer insulator film 11, to cover the upper connection wires 14a, 14b and 14c. Thus, a principal part of the memory cell of the SRAM is completed.

Although the contact hole 12c is arranged to planarly overlap with the gate electrodes 4a and 4d in the memory cell of the aforementioned SRAM as shown in FIGS. 6 to 8, the surface of the n-source region 9b can be readily exposed in a self-aligned manner without exposing the surfaces of the gate electrodes 4a and 4d by anisotropic etching due to the presence of the silicon oxide film 7 and the silicon nitride film 8 defining the etching prevention film directly covering both side surfaces of the gate electrodes 4a and 4d.

Thus, the area of the memory cell of the SRAM can be reduced without shorting the upper connection wire 14b embedded in the contact hole 12c to the gate electrodes 4a and 4d.

Further, although the contact hole 12b is arranged to planarly overlap with the field isolation film 3, the surface of the field isolation film 3 is not excessively etched due to the presence of the silicon nitride film 8 and the silicon oxide film 7.

The n⁻drain region 10a is formed in a self-aligned manner by introducing the n-type impurity through the contact part of the contact hole 12b, whereby crystal defects or the like in a portion of the element forming region located in the vicinity of the field isolation film 3 can be included therein. Thus, a leakage current from the upper connection wire 14a to the silicon substrate 1 can be suppressed. Consequently, a semiconductor device performing desired operations with a further reduced chip size can be obtained.

As shown in FIG. 5, the thickness t of the etching prevention film defined by the silicon oxide film 7 and the silicon nitride film 8 is preferably smaller than the height H of the gate electrodes 4a and 4d and the on-gate insulator films 6a and 6b. Further, the distance D between the adjacent gate electrodes 4a and 4d is preferably longer than twice the thickness t. Thus, the n⁻source region 9b can be reliably exposed on the bottom of the contact hole 12c in the step shown in FIG. 8.

The etching gases employed for forming the contact holes shown in FIGS. 6, 7 and 8 are mere examples, and the types of the etching gases are not restricted to the above so far as the etching rate for the silicon nitride film 8 is not more than 1/10 the etching rate for the interlayer insulator film 11.

Further, the present invention is not restricted to the aforementioned conditions so far as the etching rate for the silicon oxide film 7 is not more than 1/10 the etching rate for the silicon nitride film 8.

Particularly when the interlayer insulator film 11 is prepared from a silicon oxide film to which an impurity such as boron or phosphorus is added, the etching selection ratio between the interlayer insulator film 11 and the silicon nitride film 8 can be further increased.

Second Embodiment

Figure 13:
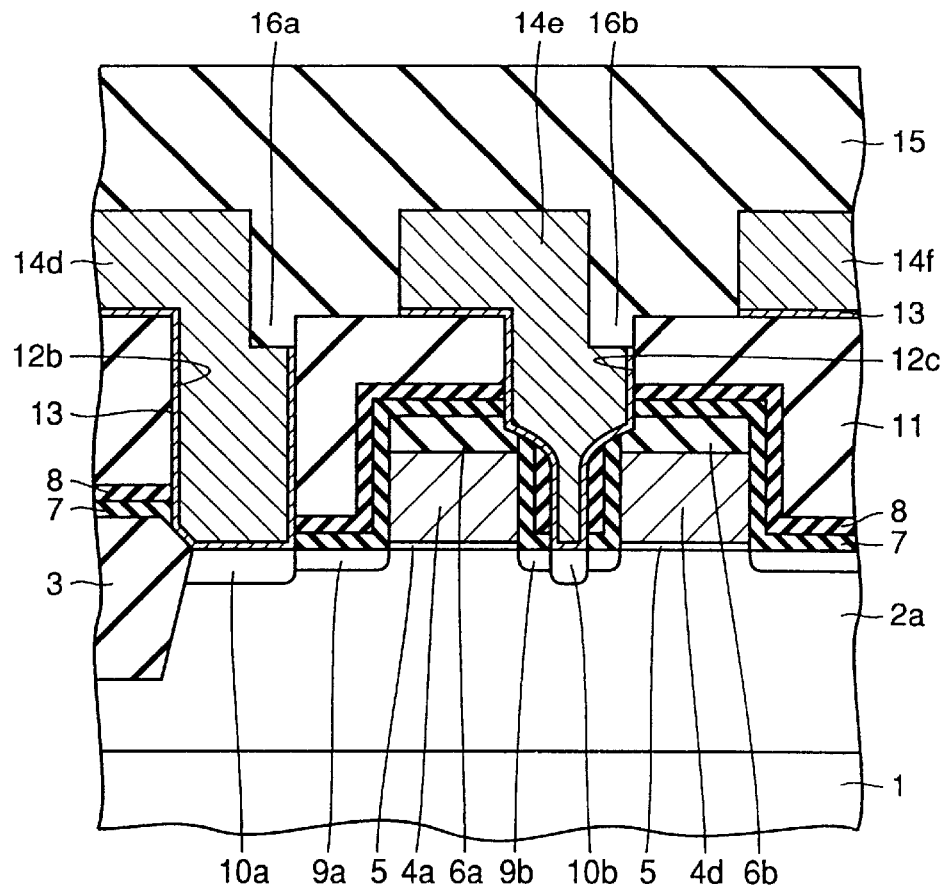
FIG. 13 is a sectional view showing a memory cell of an SRAM according to a second embodiment of the present invention.

A semiconductor device comprising a memory cell of an SRAM according to a second embodiment of the present invention is now described. Referring to FIG. 13, an upper connection wire 14d formed on an interlayer insulator film 11 is partially connected to the upper surface of a portion embedded in a contact hole 12b. An upper connection wire 14e is partially connected to the upper surface of a portion embedded in a contact hole 12c.

The remaining upper surface of the portion embedded in the contact hole 12b, not connected with the upper connection wire 14d, is on a position lower than the upper surface of the interlayer insulator film 11. Similarly, the remaining upper surface of the portion embedded in the contact hole 12c, not connected with the upper wire 14e, is on a position lower than the upper surface of the interlayer insulator film 11. The remaining structure of this embodiment is similar to the structure shown in FIG. 12 described with reference to the first embodiment, and hence identical members are denoted by the same reference numerals and redundant description is not repeated.

Figure 15:
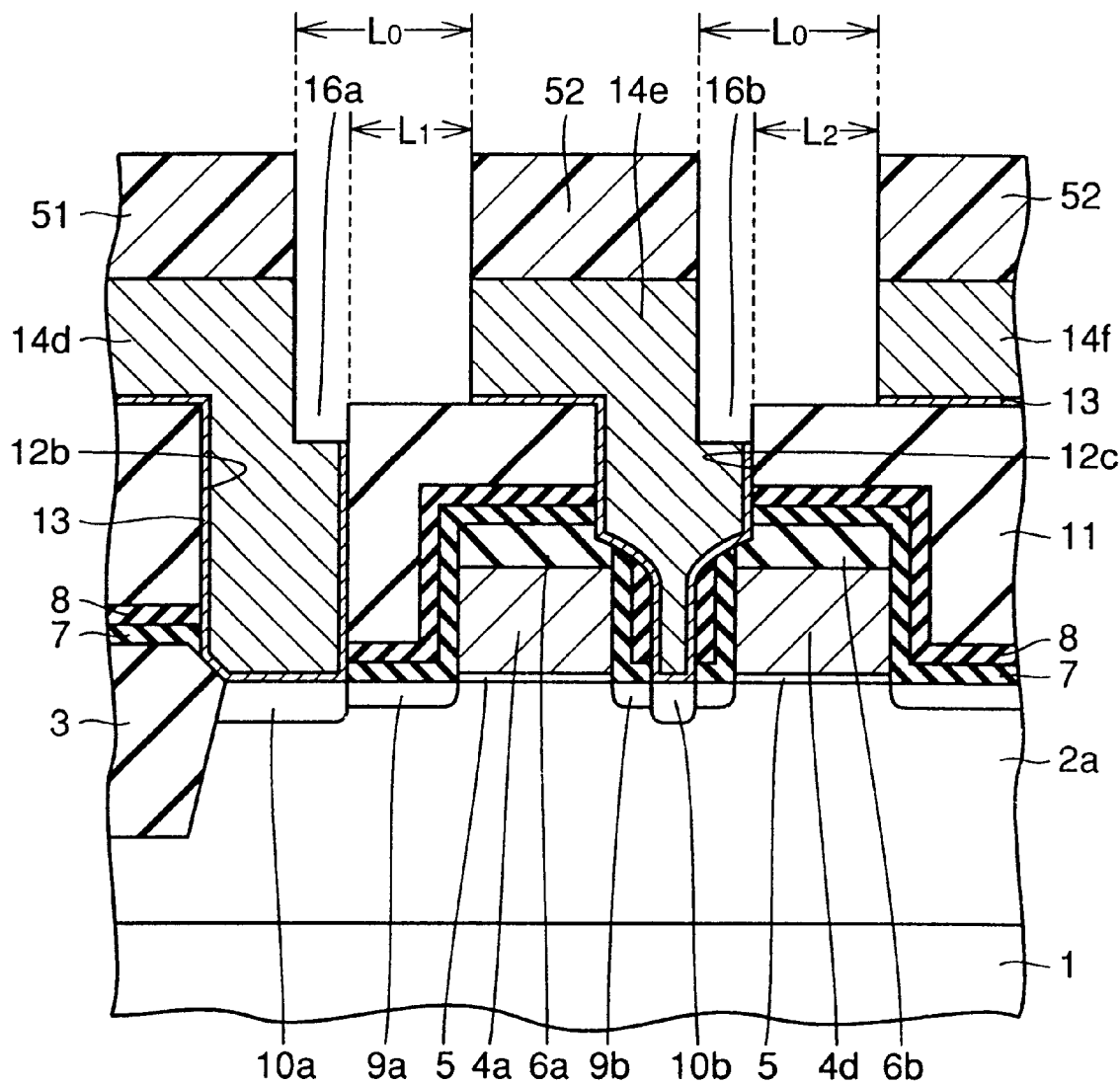
FIG. 15 is a sectional view showing a step of a method of manufacturing the memory cell of the SRAM according to the second embodiment shown in FIG. 13.

In the aforementioned memory cell, depressions 16a and 16b are formed in the portions embedded in the contact holes 12b and 12c respectively. An exemplary method of manufacturing the aforementioned memory cell is now described with reference to FIG. 15. Referring to FIG. 15, a resist pattern 52 is formed on a tungsten film 14 after a step similar to that shown in FIG. 10.

The tungsten film 14 and a barrier metal film 13 are anisotropically etched through the resist pattern 52 serving as a mask, thereby exposing the upper surface of the interlayer insulator film 11. Prescribed overetching is performed for removing etching residues remaining on the upper surface of the exposed interlayer insulator film 11.

The tungsten film 14 and the barrier metal film 13 embedded in the contact holes 12b and 12c are also etched by this overetching, for defining the depressions 16a and 16b respectively. Thereafter the resist pattern 52 is removed. Thus, the upper connection wires 14d and 14e and still another upper connection wire 14f are formed respectively.

According to the aforementioned memory cell, the distances between the upper connection wires 14d, 14e and 14f can be further reduced as compared with the memory cell described with reference to the first embodiment.

Figure 14:
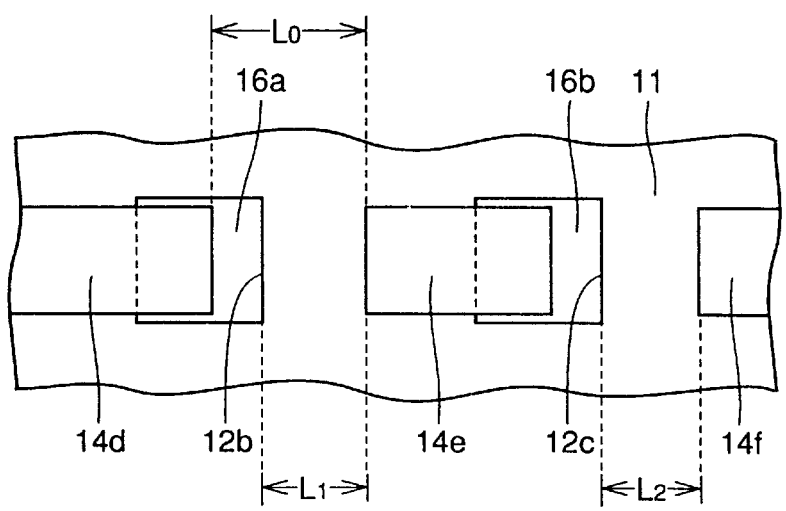
FIG. 14 is a plan view of the memory cell according to the second embodiment shown in FIG. 13.

Even if the minimum resolution width is $L_0$ as the photolithographic ability, the left end of the upper connection wire 14e can be reduced to the horizontal distance L1 from the right end of the tungsten film 14 embedded in the contact hole 12b, for example, as shown in FIGS. 14 and 15.

Similarly, the left end of the upper connection wire 14f can be reduced to the horizontal distance L2 from the right end of the tungsten film 14 embedded in the contact hole 12c. Consequently, the area of the upper connection wires 14d to 14f formed on the interlayer insulator film 11 as well as the are of the memory cell can be further reduced.

Third Embodiment

Figure 16:
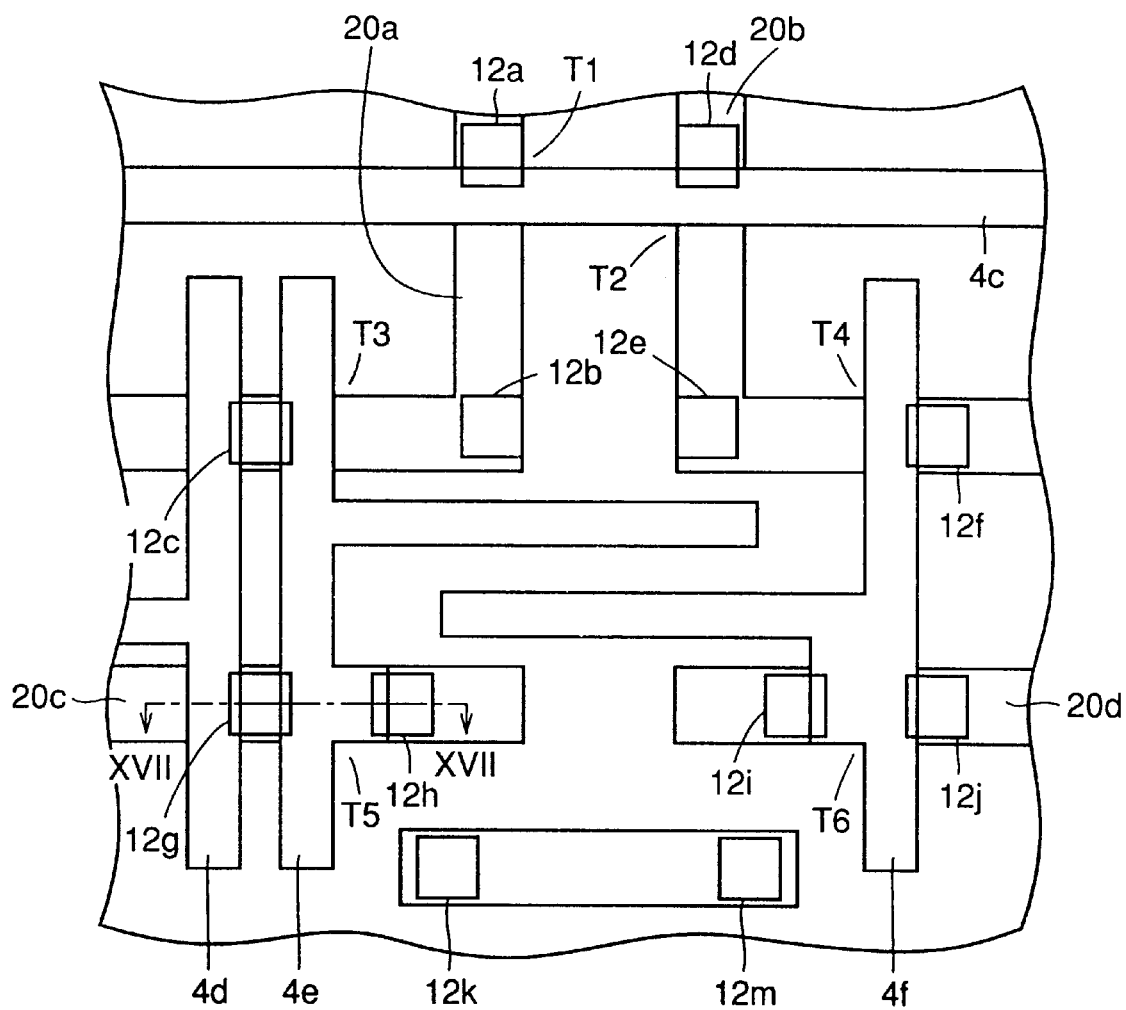
FIG. 16 is a plan view showing a memory cell of an SRAM according to a third embodiment of the present invention.
Figure 17:
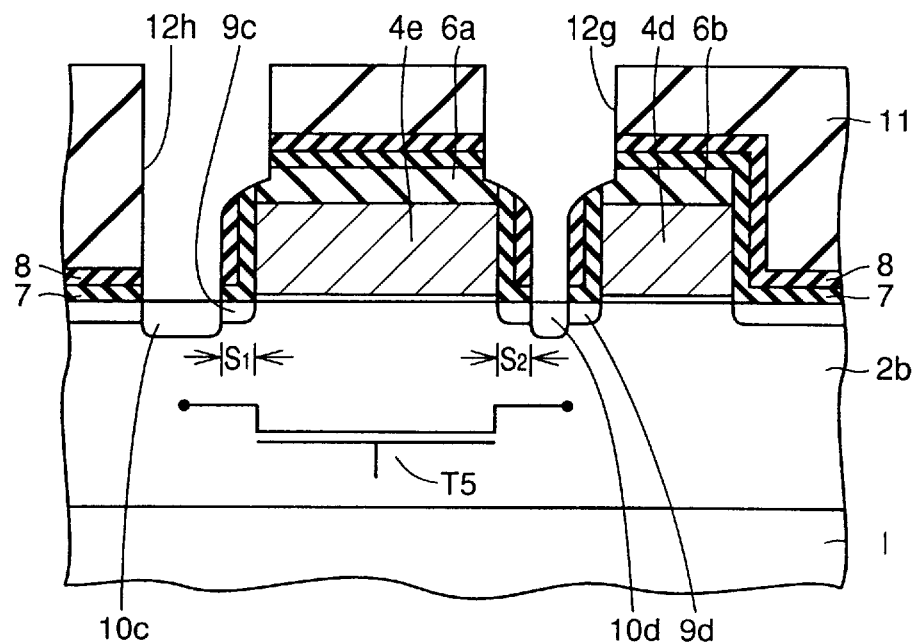
FIG. 17 is a sectional view taken along the line XVII—XVII in FIG. 16 showing the memory cell according to the third embodiment.

A semiconductor device comprising a memory cell of an SRAM according to a third embodiment of the present invention is now described. Referring to FIGS. 16 and 17, this memory cell is formed with gate electrodes 4e and 4f in particular. As shown in FIG. 17, the gate length of the gate electrode 4e is rendered larger than the remaining portions in an element forming region 20c.

Similarly, the gate length of the gate electrode 4f is rendered larger than the remaining portions in an element forming region 20d. The remaining structure of this embodiment is similar to that shown in FIG. 2 described with reference to the first embodiment, and hence identical members are denoted by the same reference numerals and redundant description is not repeated.

In this memory cell, the distance $S_1$ between an n⁺drain region 10c and a portion immediately under the side surface of the gate electrode 4e located close to the n⁺drain region 10c on the main surface of a silicon substrate 1 is substantially equal to the distance $S_2$ between an n⁺source region 10d and a portion immediately under the side surface of the gate electrode 4e located close to the n⁺source region 10d on the main surface of the silicon substrate 1 in a load transistor T5, as shown in FIG. 17.

Figure 18:
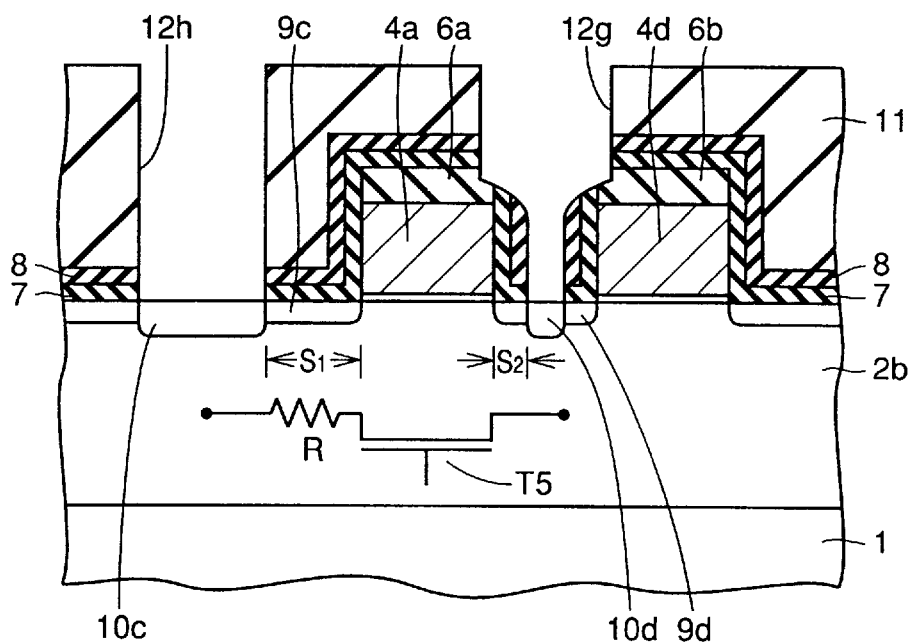
FIG. 18 is a sectional view taken along the line XVIII—XVIII in FIG. 2 for comparing the memory cell according to the third embodiment with the memory cell according to the first embodiment.
Figure 19:
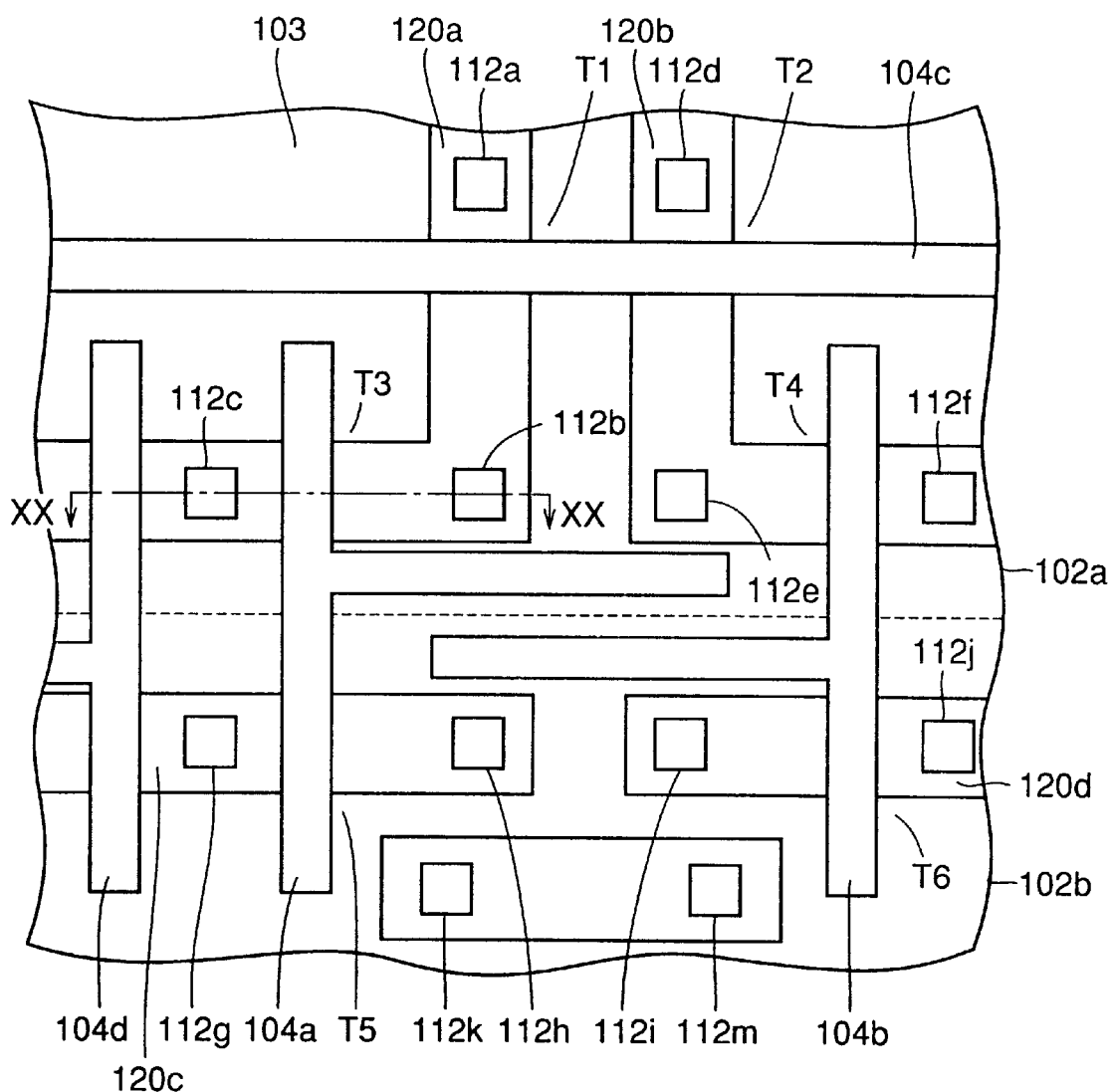
FIG. 19 is a plan view showing a conventional SRAM.
Figure 20:
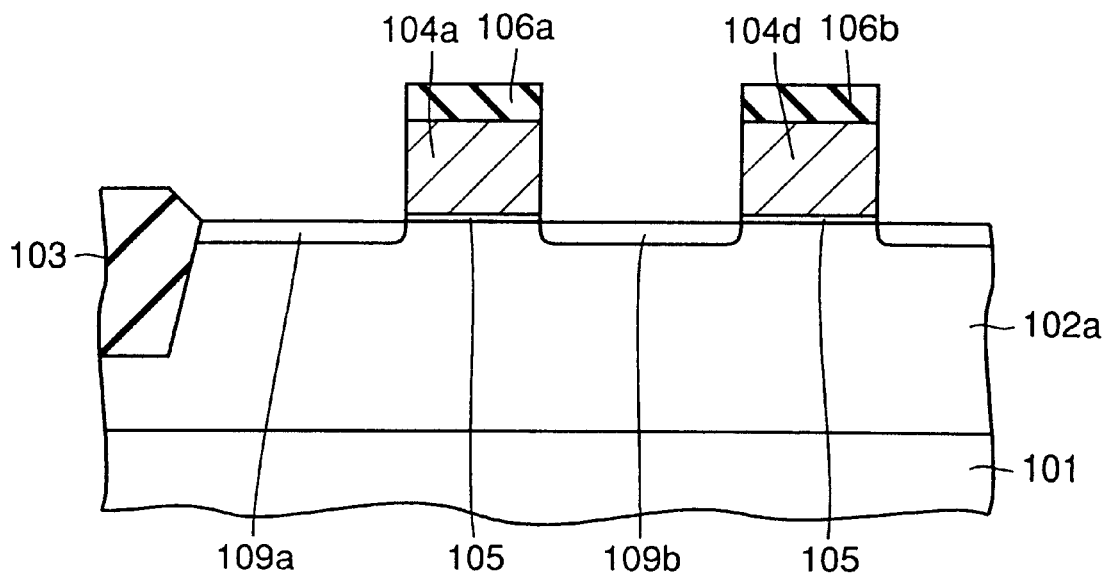
FIGS. 20 to 23 are sectional views taken along the line XX—XX in FIG. 19 for illustrating steps of a method of manufacturing a memory cell of the conventional SRAM.
Figure 21:
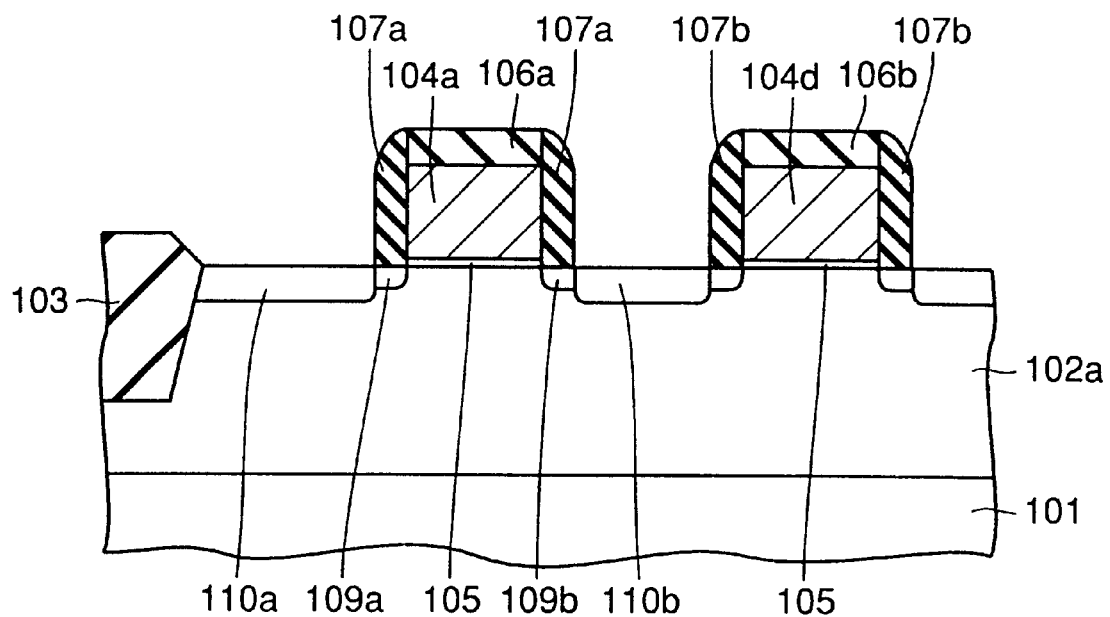
Figure 22:
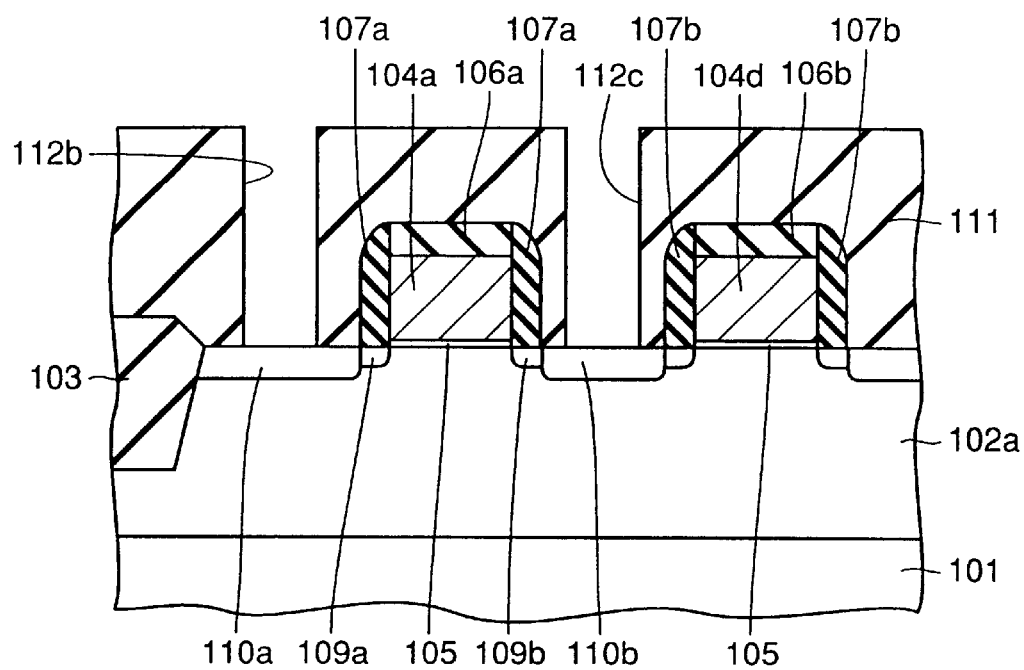
Figure 23:
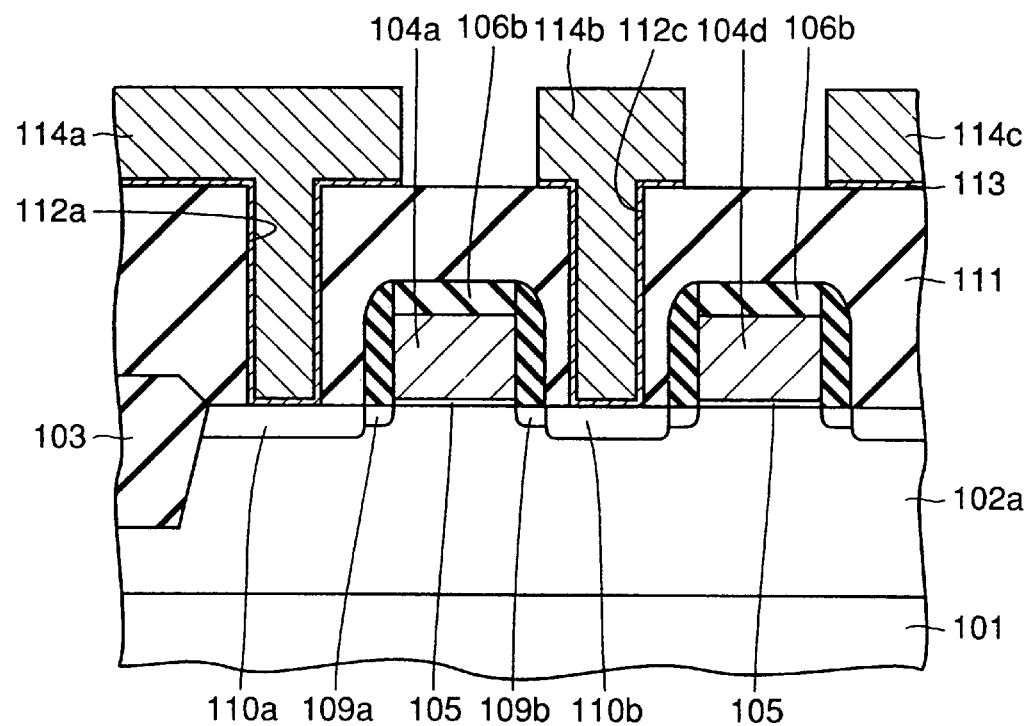

In the corresponding region of the memory cell of the SRAM described with reference to the first embodiment, the corresponding distance $S_1$ is longer than the corresponding distance $S_2$, as shown in FIG. 18. In the load transistor T5, therefore, the p⁻source region 9c forms a kind of parasitic resistance R, as shown in FIG. 18.

In the memory cell of the SRAM according to the third embodiment, the load transistor T5 and another load transistor T6 have no such parasitic resistance R, whereby dispersion of operations is reduced and the operations of the transistors are further stabilized stabilized.

On the other hand, access transistors T1 and T2 preferably have parasitic resistance. Further, driver transistors T3 and T4 preferably have no parasitic resistance.

The driver transistors T3 and T4, having parasitic resistance in the structure shown in FIG. 16, can be replaced with transistors having no parasitic resistance by properly arranging contact holes 12b and 12c.

In the access transistors T1 and T2, current drivability can be intentionally reduced due to the presence of the parasitic resistance. In the driver transistors T3 and T4, current drivability is relatively increased and dispersion of operations is reduced.

Thus, the ratio (beta ratio) of the current drivability of the driver transistors T3 and T4 to the current drivability of the access transistors T1 and T2 can be increased, thereby further stabilizing the operations of the memory cell of the SRAM.

While each of the above embodiments has been described with reference to a memory cell of an SRAM, the structure arranging the contact hole to planarly overlap with the gate electrodes is not restricted to the SRAM but also applicable to another semiconductor device such as a DRAM, for example, for readily reducing the chip size of the semiconductor chip or increasing the degree of integration of the semiconductor device.

Not only the contact holes for connection with the respective transistors but also the contact holes 12k and 12m for stabilizing the potential of the p well or the n well formed with the transistors can be arranged to planarly overlap with the field isolation film 3, thereby further reducing the chip size.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a first conductivity type region formed on the main surface of a semiconductor substrate;
    an element forming region separated on the main surface of said semiconductor substrate by an element isolation film and formed on the surface of said first conductivity type region;
    a prescribed semiconductor element formed on said element forming region;
    an insulator film formed on said semiconductor substrate to cover said semiconductor element; and
    a first contact hole formed in said insulator film for exposing the surface of said element forming region;
    said semiconductor element having:
        an electrode part formed across said element forming region,
        a pair of second conductivity type first impurity regions formed on one side and another side of said element forming region through said electrode part and having a first impurity concentration, and
        a second conductivity type second impurity region formed on at least one of said first impurity regions to include a contact part of said first contact hole and having a second impurity concentration higher than said first impurity concentration;
    an etching prevention film different in etching property from said insulator layer is formed between said insulator film and said semiconductor element to cover said electrode part in direct contact with both side surfaces of said electrode part;
    a second contact hole formed in said insulator film and arranged not to planarly overlap with said electrode part;
    a second conductivity type third impurity region including a contact part of said second contact hole, formed on another one of said first impurity regions and having a second impurity concentration higher than said first impurity concentration;
    a third contact hole formed in said insulator film and arranged to planarly overlap with said electrode part; and
    a second conductivity type fourth impurity region including a contact part of said third contact hole, formed on another one of said first impurity regions and having a second impurity concentration higher than said first impurity concentration, wherein
    said semiconductor element includes:
        a first transistor having said electrode part, said pair of first impurity regions, said second impurity region and said third impurity region, and
        a second transistor having said electrode part, said pair of first impurity regions,
    said second impurity region and said fourth impurity region,
    the distance between said third impurity region and a portion immediately under the side surface of said electrode part on the side where said third impurity region is located on the main surface of said semiconductor substrate is longer than the distance between said second impurity region and a portion immediately under the side surface of said electrode part on the side where said second impurity region is located on the main surface of said semiconductor substrate, and
    the distance between said fourth impurity region and a portion immediately under the side surface of said electrode part on the side where said fourth impurity region is located on the main surface of said semiconductor substrate is substantially identical to the distance between said second impurity region and a portion immediately under the side surface of said electrode part on the side where said second impurity region is located on the main surface of said semiconductor substrate,
    said first contact hole is arranged to planarly overlap with said electrode part.

2. The semiconductor device according to claim 1, wherein said insulator film includes a silicon oxide film, and said etching prevention film includes at least a silicon nitride film.

3. The semiconductor device according to claim 2, wherein said etching prevention film further includes a silicon oxide film formed under said silicon nitride film.

4. The semiconductor device according to claim 2, wherein said insulator film contains an impurity for improving the etching selection ratio with respect to said etching prevention film.

5. The semiconductor device according to claim 4, wherein said impurity includes phosphorus or boron.

6. The semiconductor device according to claim 1, further including another electrode part formed across said element forming region at a space from said electrode part, wherein
    said another electrode part is covered with said etching prevention film coming into direct contact with at least the side surfaces, and
    said first contact hole is arranged to planarly overlap with said another electrode.

7. The semiconductor device according to claim 6, wherein said space between said electrode part and said another electrode part is longer than twice the thickness of said etching prevention film, and
    the thickness of said etching prevention film is smaller than the height of said electrode part and said another electrode part.

8. The semiconductor device according to claim 1, wherein said third impurity region is formed by introducing an impurity through said contact part of said second contact hole.

9. The semiconductor device according to claim 1, wherein said element isolation film is covered with said etching prevention film, and
said first or second contact hole is arranged to planarly overlap with said element isolation film.

10. The semiconductor device according to claim 1, wherein the electrode length of said electrode part is larger in the portion where said first contact hole and said third contact hole planarly overlap with said electrode part as compared with the remaining portion.

11. The semiconductor device according to claim 10, wherein said first or third contact hole is arranged to planarly overlap with said element isolation film.

12. The semiconductor device according to claim 1, wherein said fourth impurity region is formed by introducing an impurity through said contact part of said third contact hole.

13. The semiconductor device according to claim 1, having a static memory cell including:
a pair of driver transistors having cross-connected gates and drains,
a pair of access transistors having sources connected to the drains of said driver transistors respectively, and
a pair of load transistors having drains connected to the drains of said driver transistors respectively and gates connected to the gates of said driver transistors respectively, wherein
said access transistors are said first transistor, and
said driver transistors and said load transistors are said second transistor.

14. The semiconductor device according to claim 1, further comprising a fourth contact hole formed in said insulator film and said element isolation film for exposing the surface of said first conductivity type region.

15. A semiconductor device comprising:
a first conductivity type region formed on the main surface of a semiconductor substrate;
an element forming region separated on the main surface of said semiconductor substrate by an element isolation film and formed on the surface of said first conductivity type region;
a prescribed semiconductor element formed on said element forming region;
an insulator film formed on said semiconductor substrate to cover said semiconductor element; and
a first contact hole formed in said insulator film for exposing the surface of said element forming region;
said semiconductor element having:
an electrode part formed across said element forming region,
a pair of second conductivity type first impurity regions formed on one side and another side of said element forming region through said electrode part and having a first impurity concentration, and
a second conductivity type second impurity region formed on at least one of said first impurity regions to include a contact part of said first contact hole and having a second impurity concentration higher than said first impurity concentration;
an etching prevention film different in etching property from said insulator layer is formed between said insulator film and said semiconductor element to cover said electrode part in direct contact with both side surfaces of said electrode part
a conductor part formed to fill up said first contact hole; and
a wiring layer formed on said insulator film and electrically connected with said conductor part, wherein
said first contact hole is arranged to planarly overlap with said electrode part
said wiring layer partially covers the upper surface of said conductor part, and
a portion of the upper surface of said conductor part not covered with said wiring layer is on a position lower than the upper surface of said insulator film.

16. A semiconductor device comprising:
an insulator film formed on the main surface of a semiconductor substrate;
a contact hole formed in said insulator film for exposing the main surface of said semiconductor substrate;
a conductor part embedded in said contact hole; and
a wiring layer formed on said insulator film and electrically connected with said conductor part, wherein
said wiring layer partially covers the upper surface of said conductor part, and
a portion of the upper surface of said conductor part not covered with said wiring layer is on a position lower than the upper surface of said insulator film.

* * * * *